(12) United States Patent
Hayashi

(10) Patent No.: US 11,509,236 B2
(45) Date of Patent: Nov. 22, 2022

(54) POWER CONVERSION DEVICE

(71) Applicant: Mitsubishi Electric Corporation, Tokyo (JP)

(72) Inventor: Ryoma Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 45 days.

(21) Appl. No.: 17/263,725

(22) PCT Filed: Mar. 1, 2019

(86) PCT No.: PCT/JP2019/007995
§ 371 (c)(1),
(2) Date: Jan. 27, 2021

(87) PCT Pub. No.: WO2020/090131
PCT Pub. Date: May 7, 2020

(65) Prior Publication Data
US 2021/0376751 A1      Dec. 2, 2021

(30) Foreign Application Priority Data
Nov. 1, 2018    (JP) .............................. JP2018-206247

(51) Int. Cl.
*H02M 3/28*     (2006.01)
*H02M 7/00*     (2006.01)
(Continued)

(52) U.S. Cl.
CPC ........... *H02M 7/003* (2013.01); *H02M 3/003* (2021.05); *H02M 3/28* (2013.01); *H05K 1/0219* (2013.01); *H05K 2201/09336* (2013.01)

(58) Field of Classification Search
CPC ........ H02M 3/003; H02M 3/28; H02M 7/007; H02M 1/44; H05K 1/0219; H05K 2201/09336
See application file for complete search history.

(56) References Cited

U.S. PATENT DOCUMENTS 4,816,984 A * 3/1989 Porst ................. H03K 17/0826
                                                      363/56.02
5,031,069 A * 7/1991 Anderson ............... H01L 24/49
                                                      361/321.1
(Continued)

FOREIGN PATENT DOCUMENTS

JP            5-299876 A     11/1993
JP            3196187 B2      8/2001
(Continued)

OTHER PUBLICATIONS

Japanese Notice of Reasons for Refusal for 2018-206247 dated, Mar. 19, 2019.
(Continued)

*Primary Examiner* — Gary L Laxton
(74) *Attorney, Agent, or Firm* — Sughrue Mion, PLLC; Richard C. Turner

(57) ABSTRACT

An object is to obtain a power conversion device that can suppress the generation of noise due to coupling and achieve the size reduction of a substrate. In a power conversion device, a main circuit wire for connecting main circuit components to form a main circuit includes a first main circuit wire and a second main circuit wire wired so as to be separated from each other on a substrate. A control wire is wired between the first main circuit wire and the second main circuit wire so as to be insulated therefrom, and the first main circuit wire and the second main circuit wire are connected to each other via the main circuit component (Continued)

placed so as to be separated from the control wire in the thickness direction of the substrate.

20 Claims, 2 Drawing Sheets

(51) Int. Cl.
*H02M 3/00* (2006.01)
*H05K 1/02* (2006.01)

(56) References Cited

U.S. PATENT DOCUMENTS 8,411,466 B2 * 4/2013 Usui ................ H02M 3/33571
363/21.06
2015/0208556 A1 7/2015 Kodama et al.

FOREIGN PATENT DOCUMENTS

| JP | 2013-005542 A | 1/2013 |
| JP | 5823020 B2 | 11/2015 |
| JP | 2016-082746 A | 5/2016 |

OTHER PUBLICATIONS

International Search Report for PCT/JP2019/007995 dated, Apr. 2, 2019 (PCT/ISA/210).
Extended European Search Report dated Nov. 23, 2021 from the European Patent Office in EP Application No. 19878757.4.

* cited by examiner

POWER CONVERSION DEVICE

CROSS REFERENCE TO RELATED APPLICATIONS

This application is a National Stage of International Application No. PCT/JP2019/007995 filed Mar. 1, 2019, claiming priority based on Japanese Patent Application No. 2018-206247 filed Nov. 1, 2018.

TECHNICAL FIELD

The present disclosure relates to a power conversion device.

BACKGROUND ART

In recent years, the higher-frequency driving of a power conversion device has been promoted, and wide-gap semiconductors such as Silicon Carbide (SiC) and Gallium Nitride (GaN) are used as switching elements of inverter circuits. The higher-frequency driving of a power conversion device has advantages that enable high-speed control such as real-time control, but also has disadvantages including the increase in heat generated in semiconductor switching elements due to the increase in switching loss, and the increase in heat generated in electrical components such as a reactor and a transformer due to the increase in copper loss and iron loss.

In response to this, a power conversion device is proposed, the power conversion device including a recess for housing an electrical component therein, a cover having a semiconductor switching element to be mounted on a flat surface on the surface side thereof, and a case having a cooling flow passage formed so as to allow a refrigerant to flow through a side surface of the recess (see Patent Document 1, for example). In the power conversion device in Patent Document 1, a circuit board is fixed to the surface side of the cover.

CITATION LIST

Patent Document

Patent Document 1: Japanese Patent No. 5823020

SUMMARY OF THE INVENTION

Problems to be Solved by the Invention

In the power conversion device in Patent Document 1, the circuit board is fixed to the upper side of the cover and the case, and a main circuit wire and a control wire are wired on a single circuit board. When the main circuit wire and the control wire are wired on a single circuit board, it is necessary to cause one of the wires to take a detour depending on the positional relationship between the main circuit wire and the control wire to prevent contact therebetween, which may lead to an increase in substrate area and size increase of the power conversion device. It is conceivable that the positions of an input connector, an output connector, and a control connector for establishing a connection with peripheral devices, are improved (for example, such that the control connector is not placed between the input connector and the output connector) so as to prevent a wire from taking a detour. However, as in the case of an on-vehicle power conversion device, for example, the positions of connectors for establishing a connection with peripheral devices may be limited. Furthermore, it is possible to wire a control wire and a main circuit wire in different wiring layers by using a multi-layer wiring substrate such that the wires cross each other, so as to prevent the wires from taking a detour. However, at the position where the wires cross each other, noise occurs due to coupling between the control wire and the main circuit wire. The noise due to coupling can be eliminated by a noise filter. However, a coil or a capacitor should be added to form a noise filter, which increases the size of a power conversion device. Accordingly, in conventional power conversion devices, it is difficult to achieve the suppression of the generation of noise due to coupling and the reduction of the size of a substrate, simultaneously.

The present disclosure has been made to solve the above problem, and an object of the present disclosure is to obtain a power conversion device that can suppress the generation of noise due to coupling and reduce the size of a substrate.

Solution to the Problems

A power conversion device according to the present disclosure includes a main circuit wire for connecting a main circuit component and a plurality of switching elements so as to configure a main circuit, and a control wire for connecting the plurality of switching elements and a control circuit for controlling driving of the plurality of switching elements, the main circuit wire and the control wire being wired on a single substrate, wherein the main circuit wire includes a first main circuit wire and a second main circuit wire wired so as to be separated from each other on the substrate, the control wire is wired between the first main circuit wire and the second main circuit wire on the substrate, and the first main circuit wire and the second main circuit wire are connected via a main circuit wire connecting part placed so as to be separated from the control wire in a thickness direction of the substrate.

Effect of the Invention

A power conversion device according to the present disclosure can suppress the generation of noise due to coupling and reduce the size of a substrate.

DESCRIPTION OF EMBODIMENTS

Embodiment 1

Figure 1:
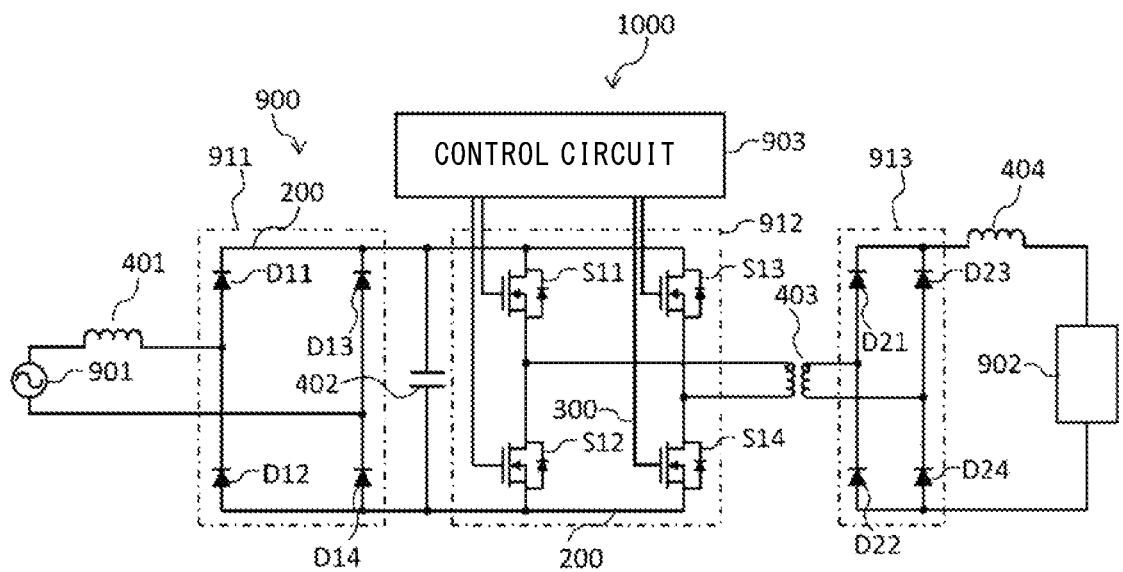
FIG. 1 is a schematic circuit diagram showing a power conversion device according to embodiment 1.
Figure 2A:
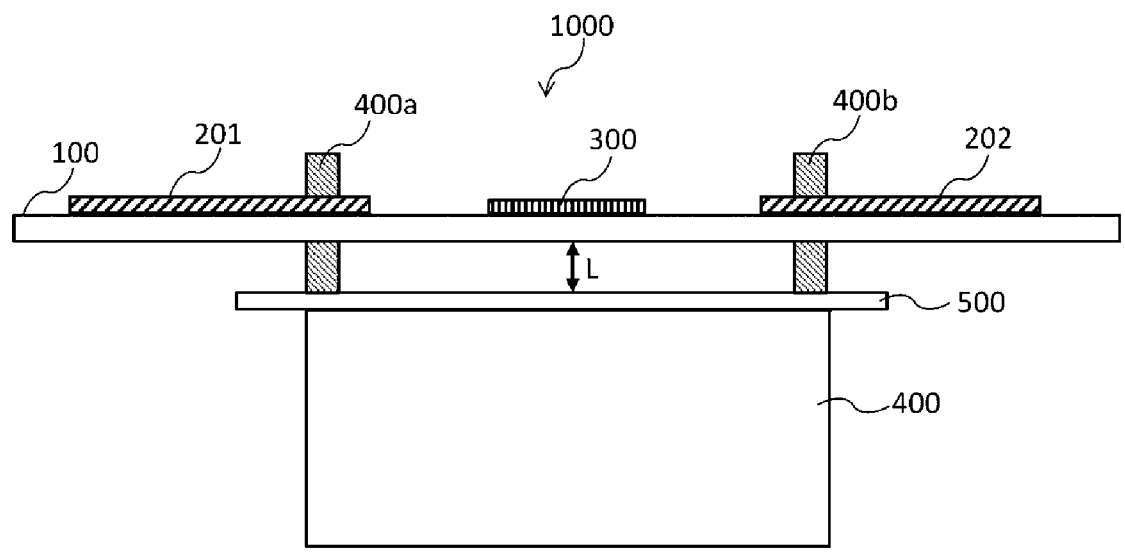
FIG. 2A is a partial side view showing the power conversion device according to embodiment 1.
Figure 2B:
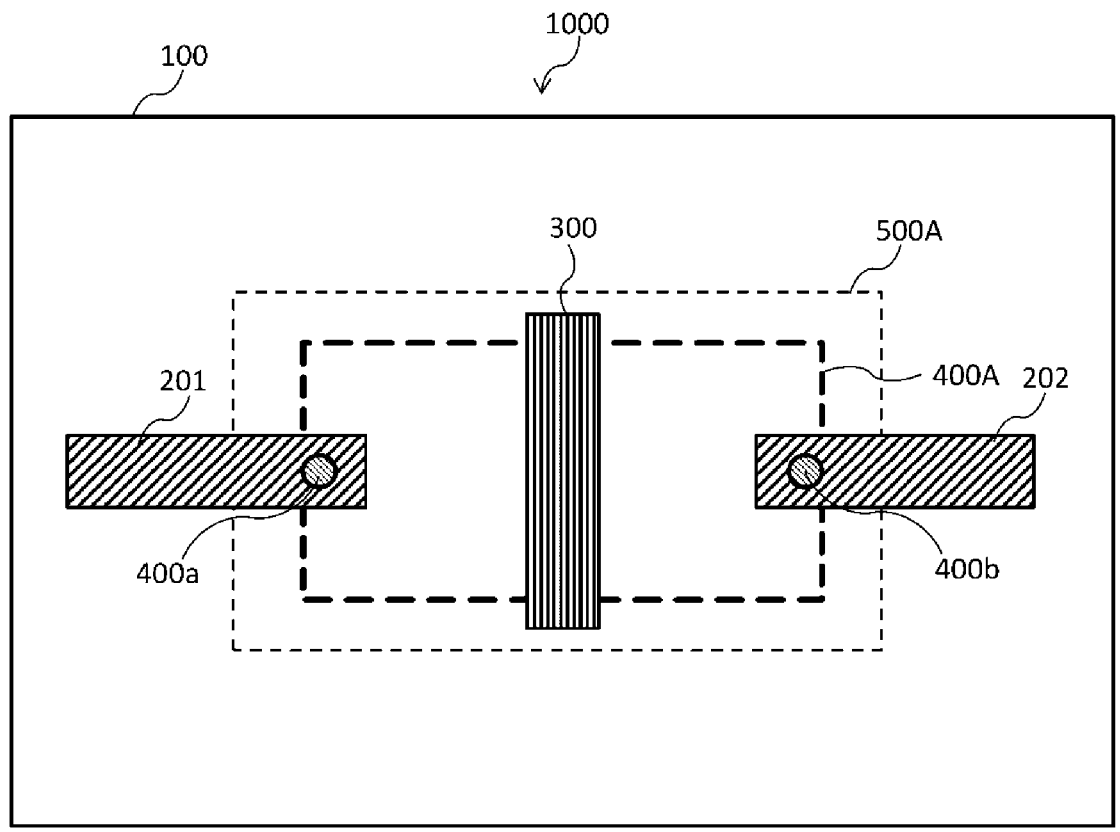
FIG. 2B is a partial plan view showing the power conversion device according to embodiment 1.

Hereinafter, embodiment 1 will be described on the basis of FIGS. 1 to 2B. FIG. 1 is a schematic circuit diagram showing a power conversion device according to embodiment 1. A power conversion device 1000 converts AC power outputted from an AC power supply 901 to DC power having a desired voltage and supplies the resultant DC power to a load 902, and includes a main circuit 900 in which current from the AC power supply 901 flows, and a control circuit 903 which controls driving of a plurality of switching elements S11 to S14 provided in the main circuit 900. The plurality of switching elements S11 to S14 and various main circuit components are connected to one another through main circuit wires 200 so as to form the main circuit 900. Additionally, the plurality of switching elements S11 to S14 and the control circuit 903 are connected via respective control wires 300 which are electrically insulated from the main circuit wires 200. Note that the "main circuit components" in embodiment 1 are a reactor 401, a capacitor 402, a transformer 403, and a reactor 404, but are not limited thereto and include all electrical components which form the main circuit in the power conversion device, as well as a combination thereof.

The main circuit 900 is configured by the primary side to which the AC power supply 901 is connected and the secondary side to which the load 902 is connected, and includes: a rectifier 911 which rectifies AC current outputted from the AC power supply 901; the capacitor 402 which smooths the current rectified by the rectifier 911 and outputs DC voltage; an inverter unit 912 which converts the DC voltage outputted from the capacitor 402 to AC voltage having a desired frequency and outputs the resultant AC voltage to a primary coil of the transformer 403; the transformer 403 which changes the voltage value of the AC voltage from the inverter unit 912 to a desired value and outputs the resultant AC voltage from a secondary coil; a rectifier 913 which rectifies current flowing by the AC voltage from the transformer 403; and the reactor 404 which smooths the current rectified by the rectifier 913 and outputs the DC current to the load 902.

The rectifier 911 is configured by a series-connected assembly of a diode D11 and a diode D12, and a series-connected assembly of a diode D13 and a diode D14, which are connected in parallel to each other. One end of the AC power supply 901 is connected to a connecting point between the diode D11 and the diode D12 via the smoothing reactor 401 and the other end of the AC power supply 901 is connected to a connecting point between the diode D13 and the diode D14.

The capacitor 402 may be a film capacitor and an aluminum electrolytic capacitor, for example, and is connected in parallel between the rectifier 911 and the inverter unit 912.

The inverter unit 912 is configured by bridge-connecting the plurality of switching elements S11 to S14, which are Insulated Gate Bipolar Transistors (IGBT) using wide-gap semiconductors such as SiC and GaN, for example. The switching elements S11 to S14 have respective base terminals connected to the control circuit 903 via the control wires 300. The control circuit 903 generates control signals corresponding to the respective switching elements, and controls driving of the switching elements by transmitting the control signals via the control wires 300. IGBTs are used as the switching elements S11 to S14 in the present disclosure, but other semiconductor switching elements such as Metal-Oxide-Semiconductor Field-Effect Transistors (MOSFET) may be used.

The transformer 403 is configured by winding, around a magnetic core (not shown) such as an iron core, a primary coil connected to the primary side of the main circuit 900 and a secondary coil connected to the secondary side of the main circuit 900 and polarized in the same direction as the primary coil, and electrically insulates the primary side and the secondary side of the main circuit 900 from each other. The primary coil and the secondary coil of the transformer 403 are magnetically connected by the magnetic core such that magnetic flux generated by AC current flowing through the primary coil is transmitted to the secondary coil via the magnetic core, and the magnetic flux generates an induced electromotive force in the secondary coil and then, the secondary coil outputs AC voltage to the rectifier 913. The magnitude of the AC voltage outputted from the secondary coil to the rectifier 913 is adjusted to a desired value by adjusting the turns ratio between the primary coil and the secondary coil of the transformer 403.

The rectifier 913 is configured by a series-connected assembly of a diode D21 and a diode D22, and a series-connected assembly of a diode D23 and a diode D24, which are connected in parallel to each other. One end of the secondary coil of the transformer 403 is connected to a connecting point between the diode D21 and the diode D22 and the other end thereof is connected to a connecting point between the diode D23 and the diode D24.

The reactor 404 is connected in series between the rectifier 913 and the load 902 so as to perform smoothing by eliminating pulsations from the current outputted from the rectifier 913.

The load 902 may be a battery, and one end thereof is connected to the reactor 404 and the other end thereof is connected to an anode terminal of the diode D24.

Note that the power conversion device shown in FIG. 1 is merely one example, and not limited thereto. For example, the power conversion device may be a DC-DC converter. In other words, the power conversion device can be any device which controls driving of switching elements connected to a main circuit by a control circuit so as to convert input power to desired power and output the resultant power.

Next, wiring of the main circuit wire 200 and the control wire 300 will be described. FIG. 2A is a partial side view and FIG. 2B is a partial plan view showing the power conversion device according to embodiment 1. FIGS. 2A and 2B show the periphery of a main circuit component 400 in the power conversion device 1000, as viewed from the side and top thereof, respectively. The main circuit component 400 shown in FIGS. 2A and 2B represents one or any combination of the various main circuit components shown in FIG. 1, i.e., the reactor 401, the capacitor 402, the transformer 403, or the reactor 404. The main circuit wire 200 is wired so as to be divided into a first main circuit wire 201 and a second main circuit wire 202 on a substrate 100 as illustrated in the drawings, and the first main circuit wire 201 and the second main circuit wire 202 are wired so as to be separated from each other in the plane direction of the substrate 100. The control wire 300 is wired between the first main circuit wire 201 and the second main circuit wire 202, and the first main circuit wire 201 and the second main circuit wire 202 are insulated from the control wire 300. Note that the substrate 100 may be a single-layer wiring substrate or a multi-layer wiring substrate. Although not shown, the control wire 300 has one end connected to a control connector which is connected to an external device and the other end connected to a control circuit and a voltage/current detection circuit.

The main circuit component 400 is mounted directly below the control wire 300 in FIG. 2A, and is placed at a position separated from the substrate 100 by a predetermined distance L in the thickness direction of the substrate 100. That is, the main circuit component 400 is placed so as to be separated from the control wire 300 in the thickness direction of the substrate 100. A plate-shaped metal member 500 which is grounded and has holes (not shown) through which a terminal 400a and a terminal 400b described later pass, is provided between the substrate 100 and the main circuit component 400, and a surface of the main circuit component 400 which faces the substrate 100 is covered by the plate-shaped metal member 500. As shown in FIG. 2B, the area of a projection plane 500A of the metal member 500 on the substrate 100 is larger than the area of a projection plane 400A of the main circuit component 400 such that the projection plane 400A of the main circuit component 400 is included within the projection plane 500A of the metal member 500. In embodiment 1, the metal member 500 is made in contact with the main circuit component 400. However, as long as the metal member 500 is placed between the substrate 100 and the main circuit component 400, the metal member 500 may be separated from the main circuit component 400. The distance L may be several centimeters, although the distance depends on the lengths of the terminals of the main circuit component described later.

The main circuit component 400 is connected to the first main circuit wire 201 and the second main circuit wire 202 via the terminal 400a and the terminal 400b respectively provided at one end and another end in the plane direction of the substrate 100. By connecting the first main circuit wire 201 and the second main circuit wire 202 to the main circuit component 400 as described above, the first main circuit wire 201 and the second main circuit wire 202 are connected via the main circuit component 400. In other words, the main circuit component 400 corresponds to a main circuit wire connecting part. The terminal 400a and the terminal 400b extend toward the substrate 100 from a surface of the main circuit component 400 which faces the substrate 100, and are connected to the first main circuit wire 201 and the second main circuit wire 202, respectively, through the holes (not shown) formed in the substrate 100. Therefore, the first main circuit wire 201 and the second main circuit wire 202 are respectively wired in accordance with the positions of the terminal 400a and the terminal 400b, and a part of each wire overlaps the projection plane 400A. In addition, since the main circuit component 400 is mounted directly below the control wire 300, a part of the control wire 300 overlaps the projection plane 400A. In embodiment 1, the first main circuit wire 201, the second main circuit wire 202, and the control wire 300 are respectively arranged so as to partially overlap the projection plane 400A. However, these wires may be each arranged so as to entirely overlap the projection plane 400A.

As described above, the terminal 400a and the terminal 400b are provided respectively at the one end and the other end in the plane direction of the substrate 100, and the first main circuit wire 201 and the second main circuit wire 202 are respectively wired in accordance with the positions of the terminal 400a and the terminal 400b of the main circuit component 400. Thus, the distance between the first main circuit wire 201 and the second main circuit wire 202 is approximately equal to the projection plane 400A. Accordingly, the larger the projection plane 400A of the main circuit component 400 is, the larger the area between the first main circuit wire 201 and the second main circuit wire 202 becomes. Thus, when the main circuit component 400 includes large components such as the transformer 403 and the reactors 401, 404 and thus the projection plane 400A is larger, the area between the first main circuit wire 201 and the second main circuit wire 202 becomes larger and the area where the control wire 300 can be wired also becomes larger.

In embodiment 1, the terminals 400a and 400b are placed on a surface of the main circuit component 400 which faces the substrate 100. However, as long as the distance between the first main circuit wire 201 and the second main circuit wire 202 is approximately equal to the width of the projection plane 400A, L-shaped terminals that bend toward the substrate 100 may be provided on side surfaces of the main circuit component 400. In other words, it is sufficient that the terminals for connecting between the main circuit component 400, and the first main circuit wire 201 and the second main circuit wire 202, respectively, are provided at the one end and the other end of the main circuit component 400 in the plane direction of the substrate 100, such that an area where the control wire 300 can be wired is formed between the first main circuit wire 201 and the second main circuit wire 202.

In embodiment 1, the main circuit component 400 is used as a main circuit wire connecting part. However, for example, a bus bar may be used for connecting the first main circuit wire 201 and the second main circuit wire 202. In addition, in the area between the first main circuit wire 201 and the second main circuit wire 202, not only the control wire 300 is wired, but also a control component connected to the control wire 300 may be placed.

According to embodiment 1, the generation of noise due to coupling can be suppressed and the size of the substrate can be reduced. More specifically, on the substrate, the first main circuit wire and the second main circuit wire which configure a main circuit wire are wired so as to be separated from each other, and the control wire is wired between the first main circuit wire and the second main circuit wire. The main circuit component is placed so as to be separated from the control wire in the thickness direction of the substrate, and the first main circuit wire and the second main circuit wire are connected to each other via the main circuit component. Therefore, it is not necessary to cause the first main circuit wire or the second main circuit wire to cross the control wire in order to connect the first main circuit wire and the second main circuit wire, and thus, the generation of noise due to coupling between the main circuit wire and the control wire can be suppressed. In addition, since the first main circuit wire and the second main circuit wire need not take a detour to avoid the control wire, the increase in size of the substrate due to the detour of the wire can be prevented, thereby achieving the size reduction. Furthermore, any coil and capacitor for noise cutting are not required, thereby achieving the size reduction and cost reduction of the power conversion device as a whole.

Since the substrate and the main circuit component are placed so as to be separated from each other by a predetermined distance in the thickness direction of the substrate, it is possible to more assuredly suppress coupling between the control wire, and the main circuit wire and the main circuit component.

Since the grounded plate-shaped metal member is placed between the main circuit component and the substrate, it is possible to further assuredly suppress coupling between the control wire, and the main circuit wire and the main circuit component, by a shielding effect.

Since the projection plane of the main circuit component on the substrate is included within the projection plane of the plate-shaped metal member on the substrate, a surface of the main circuit component which faces the substrate is entirely covered by the plate-shaped metal member. Accordingly, a shielding effect can be obtained over the entire main circuit component.

In a case where the main circuit component includes large components such as a reactor or a transformer, the area between the first main circuit wire and the second main circuit wire becomes larger and the area where the control wire can be wired also becomes larger. Accordingly, it becomes possible to wire the control wire between the first main circuit wire and the second main circuit wire in a concentrated manner, thereby allowing further size reduction of the substrate.

Note that the degree of freedom in wiring of the control wire in the projection plane of the main circuit component may be increased by changing the routing of the terminals of the main circuit component and designing a connecting point between the first main circuit wire and the second main circuit wire. In this case, further size reduction of the substrate 100 becomes possible.

Embodiment 2

Figure 3:
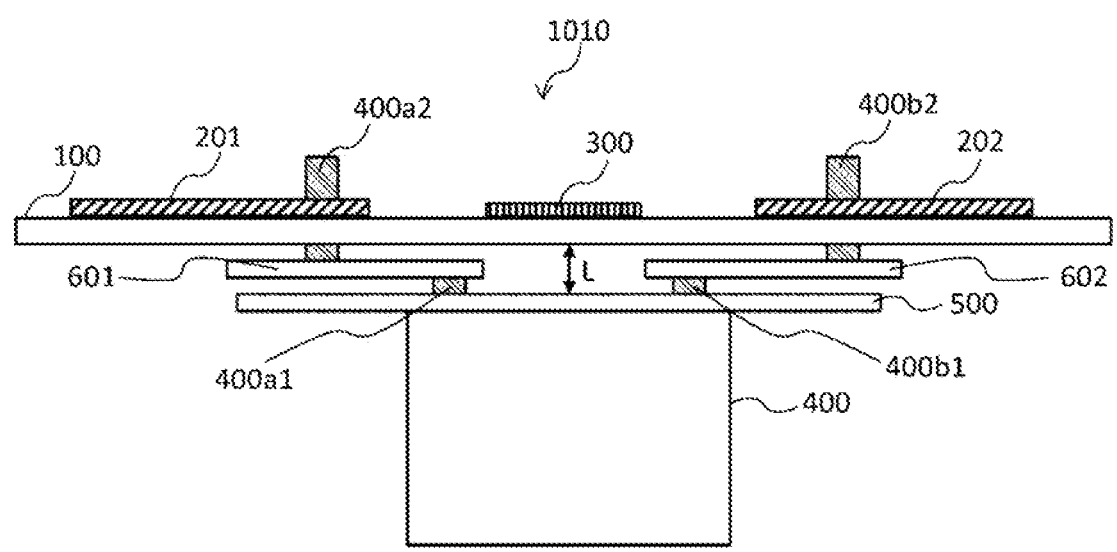
FIG. 3 is a partial side view showing a power conversion device according to embodiment 2.

Hereinafter, embodiment 2 will be discussed on the basis of FIG. 3. The components identical to or corresponding to those in FIGS. 1 to 2B are denoted by the same reference characters and the description thereof is omitted. FIG. 3 is a partial side view showing a power conversion device according to embodiment 2. FIG. 3 shows the periphery of an arbitrary main circuit component 400 of a power conversion device 1010 corresponding to the power conversion device 1000 in embodiment 1, as viewed from the side thereof. In embodiment 2, terminals for connecting the main circuit component, and the first main circuit wire and the second main circuit wire, are each divided into two divided terminals.

The main circuit component 400 is provided with a first divided terminal 400*a*1 and a first divided terminal 400*b*1 at one end and another end in the plane direction of the substrate 100. The first divided terminal 400*a*1 and the first divided terminal 400*b*1 extend toward the substrate 100 and are respectively connected to lower surfaces, i.e., surfaces facing the main circuit component 400, of conductive intermediate members 601 and 602 placed between the metal member 500 and the substrate 100. A second divided terminal 400*a*2 and a second divided terminal 400*b*2 passing through holes (not shown) formed in the substrate 100 and respectively connected to the first main circuit wire 201 and the second main circuit wire 202, are respectively connected to upper surfaces, i.e., surfaces facing the substrate 100, of the intermediate members 601 and 602.

The intermediate member 601 is a plate-shaped or bar-shaped conductive member that extends from the control wire 300 side to the first main circuit wire 201 side along the plane direction of the substrate 100. A connecting position between the intermediate member 601 and the second divided terminal 400*a*2 is placed on the outer side of the connecting position between the intermediate member 601 and the first divided terminal 400*a*1, that is, on the side closer to the first main circuit wire 201. The intermediate member 602 is a plate-shaped or bar-shaped conductive member that extends from the control wire 300 side to the second main circuit wire 202 side along the plane direction of the substrate 100. A connecting position between the intermediate member 602 and the second divided terminal 400*b*2 is placed on the outer side of the connecting position between the intermediate member 602 and the first divided terminal 400*a*1, that is, on the side closer to the second main circuit wire 202. Therefore, the first main circuit wire 201 and the second main circuit wire 202 are respectively wired in accordance with the positions of the second divided terminals 400*a*2 and 400*b*2. Accordingly, the main circuit component 400 is connected to the first main circuit wire 201 via the first divided terminal 400*a*1, the intermediate member 601, and the second divided terminal 400*a*2, and is connected to the second main circuit wire 202 via the first divided terminal 400*b*1, the intermediate member 602, and the second divided terminal 400*b*2. In other words, the first divided terminal 400*a*1, the intermediate member 601, and the second divided terminal 400*a*2 correspond to the terminal 400*a* in embodiment 1, and the first divided terminal 400*b*1, the intermediate member 602, and the second divided terminal 400*b*2 correspond to the terminal 400*b* in embodiment 1. The other components are the same as those in embodiment 1 and therefore the description thereof is omitted.

According to embodiment 2, the same effects as in embodiment 1 can be obtained. In addition, even when the size of the main circuit component is small, the area between the first main circuit wire and the second main circuit wire is enlarged, whereby an area for wiring the control wire can be ensured. More specifically, the terminals for connecting the main circuit component, and the first main circuit wire and the second main circuit wire, are divided into the first divided terminals connected to the main circuit component, and the second divided terminals connected to the first main circuit wire and the second main circuit wire, and each first divided terminal and each second divided terminal are electrically connected via a conductive intermediate member. Here, the connecting position between the second divided terminal and the intermediate member is set on the outer side of the connecting position between the first divided terminal and the intermediate member. Therefore, even when the size of the main circuit component is small and the distance between the first divided terminals is short, the distance between the second divided terminals can be made longer, and thus, the area between the first main circuit wire and the second main circuit wire can be made larger.

In embodiment 2, the terminals for connecting the main circuit component, and the first main circuit wire and the second main circuit wire, are each divided into two divided terminals. However, each terminal may be divided into three or more divided terminals.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 100 substrate
200 main circuit wire
201 first main circuit wire
202 second main circuit wire
300 control wire
400 main circuit component
400*a*, 400*b* terminal
400*a*1, 400*b*1 first divided terminal
400*a*2, 400*b*2 second divided terminal
400A projection plane 401 reactor
402 capacitor
403 transformer
404 reactor
500 metal member
500A projection plane
601, 602 intermediate member
900 main circuit
901 AC power supply
902 load
903 control circuit
911, 913 rectifier
912 inverter unit
1000, 1010 power conversion device
D11 to D14, D21 to D24 diode
S11 to S14 switching element

The invention claimed is:

1. A power conversion device comprising a main circuit wire for connecting a main circuit component and a plurality of switching elements so as to configure a main circuit, and a control wire for connecting the plurality of switching elements and a control circuit for controlling driving of the plurality of switching elements, the main circuit wire and the control wire being wired on a single substrate, wherein
the main circuit wire includes a first main circuit wire and a second main circuit wire wired so as to be separated from each other on the substrate, in a direction perpendicular to a thickness direction of the substrate,
the control wire is wired between the first main circuit wire and the second main circuit wire on the substrate, in the direction perpendicular to the thickness direction of the substrate, and
the first main circuit wire and the second main circuit wire are connected via a main circuit wire connecting part that is placed directly below the control wire so as to be separated from the control wire in the thickness direction of the substrate.

2. The power conversion device according to claim 1, wherein
the main circuit wire connecting part is placed so as to be separated from the substrate by a predetermined distance in the thickness direction of the substrate.

3. The power conversion device according to claim 1, wherein
the main circuit wire connecting part is the main circuit component.

4. The power conversion device according to claim 3, wherein
the main circuit component includes a reactor or a transformer.

5. The power conversion device according to claim 2, wherein
the main circuit wire connecting part is the main circuit component.

6. The power conversion device according to claim 5, wherein
terminals for connecting the main circuit component, and the first main circuit wire and the second main circuit wire, are composed of first divided terminals connected to the main circuit component, second divided terminals connected to the first main circuit wire and the second main circuit wire, and conductive intermediate members for electrically connecting the first divided terminals and the second divided terminals, and
connecting positions between the second divided terminals and the intermediate members are placed on the outer sides of connecting positions between the first divided terminals and the intermediate members.

7. The power conversion device according to claim 5, wherein
the main circuit component includes a reactor or a transformer.

8. A power conversion device comprising a main circuit wire for connecting a main circuit component and a plurality of switching elements so as to configure a main circuit, and a control wire for connecting the plurality of switching elements and a control circuit for controlling driving of the plurality of switching elements, the main circuit wire and the control wire being wired on a single substrate, wherein
the main circuit wire includes a first main circuit wire and a second main circuit wire wired so as to be separated from each other on the substrate,
the control wire is wired between the first main circuit wire and the second main circuit wire on the substrate,
the first main circuit wire and the second main circuit wire are connected via a main circuit wire connecting part placed so as to be separated from the control wire in a thickness direction of the substrate, and
a grounded plate-shaped metal member is placed between the main circuit wire connecting part and the substrate.

9. The power conversion device according to claim 8, wherein
a projection plane of the main circuit wire connecting part on the substrate is included within a projection plane of the metal member on the substrate.

10. The power conversion device according to claim 8, wherein
the main circuit wire connecting part is the main circuit component.

11. The power conversion device according to claim 9, wherein
the main circuit wire connecting part is the main circuit component.

12. The power conversion device according to claim 10, wherein
terminals for connecting the main circuit component, and the first main circuit wire and the second main circuit wire, are composed of first divided terminals connected to the main circuit component, second divided terminals connected to the first main circuit wire and the second main circuit wire, and conductive intermediate members for electrically connecting the first divided terminals and the second divided terminals, and
connecting positions between the second divided terminals and the intermediate members are placed on the outer sides of connecting positions between the first divided terminals and the intermediate members.

13. The power conversion device according to claim 11, wherein
terminals for connecting the main circuit component, and the first main circuit wire and the second main circuit wire, are composed of first divided terminals connected to the main circuit component, second divided terminals connected to the first main circuit wire and the second main circuit wire, and conductive intermediate members for electrically connecting the first divided terminals and the second divided terminals, and
connecting positions between the second divided terminals and the intermediate members are placed on the outer sides of connecting positions between the first divided terminals and the intermediate members.

14. The power conversion device according to claim 10, wherein the main circuit component includes a reactor or a transformer.

15. The power conversion device according to claim 11, wherein
the main circuit component includes a reactor or a transformer.

16. A power conversion device comprising a main circuit wire for connecting a main circuit component and a plurality of switching elements so as to configure a main circuit, and a control wire for connecting the plurality of switching elements and a control circuit for controlling driving of the plurality of switching elements, the main circuit wire and the control wire being wired on a single substrate, wherein
the main circuit wire includes a first main circuit wire and a second main circuit wire wired so as to be separated from each other on the substrate,
the control wire is wired between the first main circuit wire and the second main circuit wire on the substrate,
the first main circuit wire and the second main circuit wire are connected via a main circuit wire connecting part placed so as to be separated from the control wire in a thickness direction of the substrate,
terminals for connecting the main circuit component, and the first main circuit wire and the second main circuit wire, are composed of first divided terminals connected to the main circuit component, second divided terminals connected to the first main circuit wire and the second main circuit wire, and conductive intermediate members for electrically connecting the first divided terminals and the second divided terminals, and
connecting positions between the second divided terminals and the intermediate members are placed on the outer sides of connecting positions between the first divided terminals and the intermediate members.

17. The power conversion device according to claim 6, wherein
the main circuit component includes a reactor or a transformer.

18. The power conversion device according to claim 12, wherein
the main circuit component includes a reactor or a transformer.

19. The power conversion device according to claim 13, wherein
the main circuit component includes a reactor or a transformer.

20. The power conversion device according to claim 16, wherein
the main circuit component includes a reactor or a transformer.

* * * * *